(12) United States Patent
Japp et al.

(10) Patent No.: US 7,687,722 B2
(45) Date of Patent: Mar. 30, 2010

(54) HALOGEN-FREE CIRCUITIZED SUBSTRATE WITH REDUCED THERMAL EXPANSION, METHOD OF MAKING SAME, MULTILAYERED SUBSTRATE STRUCTURE UTILIZING SAME, AND INFORMATION HANDLING SYSTEM UTILIZING SAME

(75) Inventors: Robert M. Japp, Vestal, NY (US); Voya R. Markovich, Endwell, NY (US); Kostas I. Papthomas, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 509 days.

(21) Appl. No.: 11/541,776

(22) Filed: Oct. 3, 2006

(65) Prior Publication Data

US 2008/0078570 A1    Apr. 3, 2008

(51) Int. Cl.
H05K 1/03    (2006.01)
(52) U.S. Cl. .......................... 174/255; 174/260; 29/832
(58) Field of Classification Search ................. 174/255, 174/262, 260
See application file for complete search history.

(56) References Cited

U.S. PATENT DOCUMENTS

| | | |
|---|---|---|
| 3,767,756 A | 10/1973 | Blades |
| 3,869,429 A | 3/1975 | Blades |
| 3,869,430 A | 3/1975 | Blades |
| 3,953,566 A | 4/1976 | Gore |
| 4,187,390 A | 2/1980 | Gore |
| 4,477,512 A * | 10/1984 | Thomas et al. .............. 442/180 |
| 4,482,516 A | 11/1984 | Bowman et al. |
| 4,501,787 A * | 2/1985 | Marchetti et al. ........... 442/232 |
| 4,729,921 A | 3/1988 | Tokarsky |
| 5,246,817 A | 9/1993 | Shipley, Jr. |
| 5,314,742 A | 5/1994 | Kirayoglu et al. |
| 5,418,689 A | 5/1995 | Alpaugh et al. |
| 5,652,055 A | 7/1997 | King et al. |
| 6,207,595 B1 | 3/2001 | Appelt et al. |
| 6,323,436 B1 | 11/2001 | Hedrick et al. |
| 6,486,235 B2 * | 11/2002 | Cooray et al. ............... 523/451 |
| 6,900,269 B2 | 5/2005 | Hwang et al. |
| 7,084,194 B2 * | 8/2006 | Hwang et al. ............... 523/435 |
| 2002/0119317 A1 | 8/2002 | Gan et al. |
| 2004/0110874 A1 | 6/2004 | Chiou et al. |
| 2005/0165209 A1 | 7/2005 | Kurita et al. |

* cited by examiner

*Primary Examiner*—Ishwarbhai B Patel
(74) *Attorney, Agent, or Firm*—Mark Levy; Lawrence R. Fraley; Hinman, Howard & Kattell (57) ABSTRACT

A circuitized substrate including a composite layer comprising a first dielectric sub-layer comprised of a halogen-free resin and fibers dispersed therein and a second dielectric sub-layer without fibers but also including a halogen-free resin with inorganic particulates therein. A method of making such a substrate is also provided, as is a multilayered assembly including one or more such circuitized substrates, possibly in combination with other substrates. An information handling system designed for having one or more such circuitized substrates is also provided.

33 Claims, 3 Drawing Sheets

HALOGEN-FREE CIRCUITIZED SUBSTRATE WITH REDUCED THERMAL EXPANSION, METHOD OF MAKING SAME, MULTILAYERED SUBSTRATE STRUCTURE UTILIZING SAME, AND INFORMATION HANDLING SYSTEM UTILIZING SAME

TECHNICAL FIELD

The present invention relates to circuitized substrates, e.g., printed circuit boards (PCBs), chip carriers, and the like, and to processes for manufacturing same. More particularly, the invention relates to substrates used in such final products so as to provide same with enhanced properties such as low moisture absorption, increased circuit density, etc.

CROSS REFERENCE TO CO-PENDING APPLICATIONS

In Ser. No. 10/812,890, entitled "CIRCUITIZED SUBSTRATE, METHOD OF MAKING SAME, ELECTRICAL ASSEMBLY UTILIZING SAME, AND INFORMATION HANDLING SYSTEM UTILIZING SAME", filed Mar. 31, 2004, there is defined a circuitized substrate comprising a first layer comprised of a dielectric material including a resin material including a predetermined quantity of particles therein and not including continuous fibers, semi-continuous fibers or the like as part thereof, and at least one circuitized layer positioned on the dielectric first layer. An electrical assembly and a method of making the substrate is also provided, as is a circuitized structure including the circuitized substrate in combination with other circuitized substrates having lesser dense thru-hole patterns. An information handling system incorporating the circuitized substrate of the invention as part thereof is also provided. Ser. No. 10/812,890 is now U.S. Pat. No. 7,078,816.

In Ser. No. 10/920,235, entitled "LOW MOISTURE ABSORPTIVE CIRCUITIZED SUBSTRATE, METHOD OF MAKING SAME, ELECTRICAL ASSEMBLY UTILIZING SAME, AND INFORMATION HANDLING SYSTEM UTILIZING SAME", filed Jul. 18, 2004, there is defined a circuitized substrate comprising a first layer comprised of a dielectric material including a low moisture absorptive polymer resin in combination with a nodular fluoropolymer web encased within the resin, the resulting dielectric layer formed from this combination not including continuous or semi-continuous fibers as part thereof. The substrate further includes at least one circuitized layer positioned on the dielectric first layer. An electrical assembly and a method of making the substrate are also provided, as is an information handling system (e.g., computer) incorporating the circuitized substrate of the invention as part thereof. The dielectric material taught in Ser. No. 10/920,235 represents an improved material for substrates of the type defined in Ser. No. 10/812,890.

In Ser. No. 11/086,323, entitled "LOW MOISTURE ABSORPTIVE CIRCUITIZED SUBSTRATE WITH REDUCED THERMAL EXPANSION, METHOD OF MAKING SAME, ELECTRICAL ASSEMBLY UTILIZING SAME, AND INFORMATION HANDLING SYSTEM UTILIZING SAME" and filed Mar. 23, 2005, there is defined a circuitized substrate including a composite layer including a first dielectric sub-layer including a plurality of fibers having a low coefficient of thermal expansion and a second dielectric sub-layer of a low moisture absorptivity resin, the second dielectric sub-layer not including continuous or semi-continuous fibers or the like as part thereof. The substrate further includes at least one electrically conductive layer as part thereof. An electrical assembly and a method of making the substrate are also provided, as is an information handling system (e.g., computer) incorporating the circuitized substrate of the invention as part thereof.

All of the above applications (and patent) are assigned to the same Assignee as the present invention.

BACKGROUND OF THE INVENTION

Circuitized substrates such as PCBs, laminate chip carriers, and the like permit formation of multiple circuits in a minimum volume or space. Such structures typically comprise a stack of layers of signal, ground and/or power planes (lines) separated from each other by a layer of dielectric material. The lines on one plane are often in electrical contact with those on another plane by plated holes passing through the dielectric layers. The plated holes are often referred to as "vias" if internally located, "blind vias" if extending a predetermined depth within the board from an external surface, or "plated-thru-holes" (PTHS) if extending substantially through the board's full thickness. By the term "thru-hole" as used herein is meant to include all three types of such board openings, or "holes."

Methods which are known for making PCBs, chip carriers and the like typically comprise fabrication of separate innerlayer circuits (circuitized layers), which are formed by coating a photosensitive layer or film over a copper layer of a copper clad inner-layer base material. The photosensitive coating is imaged, developed and the exposed copper is etched to form the desired number of conductor lines. The photosensitive film is then stripped from the copper, leaving the circuit pattern on the surface of the inner-layer base material. Often, this methodology is referred to as photolithographic processing in the PCB art. Added description is not believed necessary in view of such known teachings.

Formation of a multilayered "stack", which in turn follows formation of the desired number of inner-layer circuits, is accomplished by preparing a lay-up of inner-layers, ground planes, power planes, etc., typically separated from each other by a layer of dielectric "pre-preg" material, which usually includes a layer of glass cloth (e.g., fiberglass) impregnated with a partially cured material (e.g., a "B-stage" epoxy resin). The outermost (top and bottom) layers of the stack usually comprise copper clad, glass-filled, epoxy planar substrates with the copper cladding comprising exterior surfaces of the stack. This stack is laminated to form a monolithic structure using heat and pressure to fully cure the B-stage resin. As understood, the resulting stack typically has metal (usually copper) cladding on both of its exterior surfaces. Exterior circuit layers are formed in the copper cladding using procedures similar to the procedures used to form the inner-layer circuits. In a well known such procedure, a photosensitive film is applied to the copper cladding, exposed to patterned activating radiation, and developed. An etchant is then used to remove copper bared by the development of the photosensitive film. Finally, the remaining photosensitive film is removed to provide the exterior circuit layers. Various elements of these outer layers, such as pads, may then be electrically coupled to selected electronic components mounted on the structure, such components including capacitors, resistors, modules, and the like, including even semiconductor chips.

Electrically conductive thru-holes (or "interconnects", as often referred to in the art) are used to electrically connect individual circuit layers within the structure to each other and/or to the outer surfaces, these thru-holes passing through all or a portion of the "stack". Thru-holes are generally formed prior to the formation of circuits on the exterior surfaces by drilling holes through the stack at appropriate locations. Following several pre-treatment steps, the walls of the holes are typically catalyzed by contact with a plating catalyst and metallized, typically by contact with an electroless or electrolytic copper plating solution to form conductive pathways between circuit layers. Following formation of the conductive thru-holes, exterior circuits, or outer conductive layers are formed using the above procedure(s).

Subsequent to the construction described above, the aforementioned semiconductor chips and/or other electrical components are mounted at appropriate locations on the exterior circuit layers of the multilayered structure, typically using solder mount pads to bond the components. These components are usually in electrical contact with the circuits within the structure through the conductive thru-holes, as desired. Such solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photo-imageable solder mask may be coated onto the board and then exposed and developed to yield an array of openings defining the pads. The openings are then coated with solder using processes known to the art, one known process being wave soldering.

There are increased demands in the complexities of the designs for many of the products discussed herein in recent years. By way of example, mainframe computer PCBs may now require as many as thirty-six layers of circuitry or more, with the complete structure having a thickness of as much as about 0.250 inch (250 mils). These boards are typically designed with about three or five mil wide signal lines and twelve mils or less diameter thru-holes. For increased circuit densification in many of today's products such as PCBs, chip carriers and the like, the industry desires to reduce signal lines to a width of two mils or less and thru-hole diameters to two mils or less. Most known commercial procedures, especially those of the nature described herein, are incapable of economically forming the dimensions desired by the industry in a cost effective manner.

Circuitized substrate manufacturers, in addition to requiring decreasing line widths and thru-hole diameters in order to provide even greater circuit densities, also obviously desire to avoid manufacturing problems frequently associated with their products. As stated, current processes utilize inner-layer materials that are typically glass-reinforced resin or other suitable dielectric material layers having a thickness of from about two to five mils, clad with metal (typically copper) on both surfaces. Glass-reinforcing material, typically utilizing continuous strands of fiberglass which extend throughout the width and length of the overall final substrates, is used to contribute strength and rigidity to the final stack. Being continuous, these strands commonly run the full width (or length) of the structure and include no breaks or other segments as part thereof. Thus, by the term "continuous" as used herein to define fibrous materials is meant a structure such as a woven cloth of lengthy fibers, including fibers which, as stated, typically run the full distance through the structure. By the term "semi-continuous" as used herein (below) to define fibrous materials is meant structures with much shortened length fibers, which are also referred to as "chopped" fibers, such as chopped fiber mats. Such fibrous materials occupy a relatively significant portion of the substrate's total volume, a disadvantage especially when attempting to produce highly dense numbers of thru-holes and very fine line circuitry to meet new, more stringent design requirements. More specifically, when holes are drilled (typically using laser or mechanical drills) to form these needed thru-holes, end segments of the fiberglass fibers may extend into the holes during lamination, and, if so, must be removed prior to metallization. This removal, in turn, creates the need for additional pretreatment steps such as the use of glass etchants to remove the glass fibrils extending into the holes, subsequent rinsing, etc. If the glass is not removed, a loss of continuity might occur in the internal wall metal deposit. In addition, both continuous and semi-continuous glass fibers add weight and thickness to the overall final structure, yet another disadvantage associated with such fibers. Additionally, since lamination is typically at a temperature above 150 degrees C., the resinous portion of the laminate usually shrinks during cooling to the extent permitted by the rigid copper cladding, which is not the case for the continuous strands of fiberglass or other continuous reinforcing material used. The strands thus take on a larger portion of the substrate's volume following such shrinkage and add further to complexity of manufacture in a high-density product. If the copper is etched to form a discontinuous pattern, laminate shrinkage may not be restrained even to the extent above by the copper cladding. Obviously, this problem is exacerbated as feature sizes (line widths and thicknesses, and thru-hole diameters) decrease. Consequently, even further shrinkage may occur. The shrinkage, possibly in part due to the presence of the relatively large volume percentage of continuous or semi-continuous fiber strands in the individual layers used to form a final product possessing many such layers, may have an adverse affect on dimensional stability and registration between said layers, adding even more problems for the PCB manufacturer.

Glass fiber presence, especially woven glass fibers, also substantially impairs the ability to form high quality, very small thru-holes using a laser. Glass cloth has drastically different absorption and heat of ablation properties than typical thermo-set or thermo-plastic matrix resins. In a typical woven glass cloth, for example, the density of glass a laser might encounter can vary from approximately 0% in a window area to approximately 50% by volume or even more, especially in an area over a cloth "knuckle". This wide variation in encountered glass density leads to problems obtaining the proper laser power for each thru-hole and may result in wide variations in thru-hole quality, obviously unacceptable by today's very demanding manufacturing standards. Glass fiber presence also often contributes to an electrical failure mode known as CAF growth. CAF (cathodic/anodic filament) growth often results in an electrical shorting failure which occurs when dendritic metal filaments grow along an interface (typically a glass fiber/epoxy resin interface), creating an electrical path between two features which should remain electrically isolated. Whether continuous (like woven cloth) or semi-continuous (like chopped fiber mattes), glass fiber lengths are substantial in comparison to the common distances between isolated internal features, and thus glass fibers can be a significant detractor for PCB insulation resistance reliability. While the use of glass mattes composed of random discontinuous chopped fibers (in comparison to the longer fibers found in continuous structures) can largely abate the problem of inadequate laser drilled thru-hole quality, such mattes still contain fibers with substantial length compared to internal board feature spacing and, in some cases, offer virtually no relief from the problem of this highly undesirable type of growth.

In published U.S. Patent Application 20050165209, there is described a non-halogen polyamide-imide resin soluble in an amide solvent at a concentration of 10%, the resulting varnish, when stored at five degrees Celsius (C) for one month, exhibiting a solution viscosity change, expressed as an absolute value, of not greater than 3.0, and the resin having a moisture absorption (25 degrees C., 90% RH, 24 hours) of not greater than 2.0%; a flexible metal-clad laminate using such a resin; and a flexible printed wiring board prepared from such a flexible metal-clad laminate by circuit formation. The flexible metal-clad laminate allegedly does not curl, including under high humid conditions, and exhibits dimensional stability since the heat resistant resin used as an insulation material has low moisture absorption and low thermal expansion coefficient and there is less internal stress in the flexible metal-clad laminate. Because the solder heat resistance and insulation properties are allegedly not impaired after humidification and since the heat resistant resin is soluble in organic solvents with high solution stability, the flexible metal-clad laminate is apparently inexpensively produced.

In published U.S. Patent Application 20040110874, there is described a halogen-free, phosphorus-free poly-cyclic compound used as a flame retardant. This compound has amide and hydroxy groups, and thus it is able to react with an epoxy resin to form a reactive type flame-retardant advanced epoxy resin. The epoxy resin and an inorganic additive are mixed to form a halogen-free, phosphorus-free flame-retardant epoxy composition, which can be used in the manufacture of a printed circuit board and as an encapsulation material for a semi-conductor device.

In published U.S. Patent Application 20020119317, there is described a flame retardant phosphorus element-containing epoxy resin composition substantially free of halogen, including: (I) a non-halogenated epoxy resin material selected from: (A) a non-halogenated phosphorus element-containing epoxy resin; (B) a mixture of: (1) a non-halogenated, non-phosphorus element-containing epoxy resin, and (2) a phosphorus element-containing compound; or (C) the reaction product of: (1) a non-halogenated epoxy resin; and (2) a phosphorus element-containing compound; or (D) a combination of two or more of components (A) to (C); and (II) (A) a multi-functional phenolic crosslinking agent having a hydroxy functionality of at least 2; (B) a material which forms a multifunctional phenolic crosslinking agent having a hydroxy functionality of at least 2, upon heating or (C) a mixture of components (A) and (B); in an amount of from about 50% to about 150% of the stoichiometric amount needed to cure the epoxy resin. Laminate printed circuit boards having reduced flammability may be made from these compositions.

In U.S. Pat. No. 6,900,269, there is described a halogen-free resin composition comprising: (A) one or more phosphorus-containing epoxy resins; (B) a hardener; (C) a hardening accelerator; (D) a polyphenylene oxide resin; and (E) a filling material. The resin composition is claimed to have excellent heat resistance, flame retardant and dielectric properties, and is allegedly useful in the formation of bonding sheets, composite materials, laminated plates, printed circuit boards, copper foil adhesives, inks used for build-up process, semiconductor packaging materials and the like.

In U.S. Pat. No. 6,323,436, PCBs are prepared by first impregnating a non-woven aramid chopped fiber mat or a thermoplastic liquid crystalline polymer (LCP) paper instead of the reinforcement typically used in the electronics industry, described in this patent as a woven glass fabric. This aramid reinforcement matte is comprised of a random (in-plane) oriented mat of p-aramid (poly (p-phenylene terephthalamide)) fibers comprised of Kevlar (Kevlar is a registered trademark of E. I. duPont deNemours and Company), and has a dielectric constant of 4.0 as compared to 6.1 for standard E-glass cloth. The lower permittivity of the non-woven aramid reinforcement provides for faster signal propagation, allowing increased wiring density and less crosstalk, which becomes increasingly important for high I/O chips and miniaturization. Since the p-aramid fibers are transversely isotropic and have an axial CTE of about −3 to about −6 ppm/degrees Celsius (hereinafter C) when combined with a thermosetting resin, the final composite described in this patent is said to possess a CTE which can be controlled and adjusted to match that of silicon or semiconductor chips in the range of about 3 to about 10 ppm/degrees C. The thermoplastic liquid crystal polymer (LCP) paper is a material called Vecrus (Vecrus is a registered trademark of Hoechst Celanese Corp.), which uses the company's Vectra polymer as part thereof (Vectra also being a registered trademark of Hoechst Celanese Corp.). According to this patent, the paper has a dielectric constant of 3.25, a dissipation factor of 0.024 at 60 Hertz (Hz), a UL 94-V0 rating and an in-plane CTE of less than 10 ppm/degrees C. The alleged advantages of this material over the aramid mat are the lower dielectric constant and very low moisture absorption, allegedly less than 0.02%. The non-woven aramid or LCP paper is used in conjunction with a thermosetting resin to form the final composite substrate. Examples of thermosetting resins useful in this patent include epoxy, cyanate ester, bismaleimide, bismaleimide-triazine, maleimide or combinations thereof. The resin-impregnated low CTE reinforcement is then partially cured to a "B"-stage to form the pre-preg, and then the pre-preg is cut, stacked, and laminated to form a sub-composite with exterior copper sheets.

In U.S. Pat. No. 6,207,595, there is described another example of a dielectric material composition for use in a PCB in which the dielectric layer's fabric material is made from a cloth member having a low enough content of particulates and a sufficient quantity of resin material to completely encase the cloth member including the particulates, so that the resin material extends beyond the highest protrusions of the cloth member (i.e. the fabric material is thicker and will pass a certain test standard (in '595, the known HAST level A test). Thus, the woven cloth is known to include a quantity of particulates, which term is meant in '595 to include dried film, excess coupler, broken filaments, and gross surface debris. A process is described where a sizing of polyvinyl alcohol, corn starch and a lubricant of oil is applied to the strands of fiber prior to weaving in order to improve the weaving process and minimize breakage of the strands. After weaving, the sizing is removed by a firing step to clean the filaments of lubricants and other materials. However, some sizing is randomly left behind as particulates. Encasing the woven cloth including the particulates is a quantity of hardened resin material. The resin may be an epoxy resin such as one often used for "FR4" composites ("FR4" has become a conventional, abbreviated name for the resulting substrates and often also for the resins forming part thereof, and is based in part on the flame retardant (hence the "FR" designation) rating of these established products). A resin material based on bismaleimide-triazine (BT) is also acceptable for the structure in this patent. More preferably, the resin is a phenolically hardenable resin material known in the PCB industry. This patent thus requires continuous fibers (those extending across the entire width (or length) of the dielectric layer except for possible inadvertent interruptions caused by drilling of the thru-holes needed in the final product, causing these fibers to become what might be called as "broken." The aforementioned problem with fiber strands exposed to the holes is thus possible in this patent's process and resulting structure.

In U.S. Pat. No. 5,418,689, there is described a PCB product wherein the dielectric substrate can include a thermoplastic and/or thermosetting resin. Thermosetting polymeric materials mentioned in this patent include epoxy, phenolic base materials, polyimides and polyamides. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene polymers, polyvinylidene fluoride and polyhexafluoropropylene. The dielectric materials may be molded articles of the polymers containing fillers and/or reinforcing agents such as glass filled polymers. "FR4" epoxy compositions that are employed in this patent contain 70-90 parts of brominated polyglycidyl ether of bisphenol-A and 10-30 parts of tetrakis(hydroxyphenyl)ethane tetraglycidyl ether cured with 3-4 parts of dicyandiamide, and 0.2-0.4 parts of a tertiary amine, all parts being parts by weight per hundred parts of resin solids. Another "FR4" epoxy composition may contain about 25 to about 30 parts by weight of a tetrabrominated digylcidyl ether of bisphenol-A having an epoxy equivalent weight of about 350 to about 450; about 10 to about 15% by weight of a tetrabrominated glycidyl ether of bisphenol-A having an epoxy equivalent weight of approximately 600 to about 750 and about 55 to about 65 parts per weight of at least one epoxidized, nonlinear novolak having at least 6 terminal epoxy groups; along with suitable curing and/or hardening agents. A still further "FR4" epoxy composition contains 70 to 90 parts of brominated polyglycidyl ether of bisphenol-A and 10 to 30 parts of tetrakis(hydroxyphenyl)ethane tetraglycidyl ether cured with 0.8-1 phr of 2-methylimidazole. Still other "FR4" epoxy compositions employ tetrabromobisphenol-A as the curing agent along with 2-methylimidazole as the catalyst.

In U.S. Pat. No. 5,314,742, there is described the use of non-woven aramid sheets to provide reinforcement for the resulting laminate. The reinforcing aramid sheet is described as having a coefficient of thermal expansion (CTE) of less than 10 ppm/degree C. and is prepared from 75 to 95 wt. % p-aramid floc and from 5 to 25 wt. % poly(m-phenylene isophthalamide) fibrids. Floc is defined in U.S. Pat. No. 4,729,921. Para-aramid fibers are very high in strength and modulus. Examples of para-aramid fibers are set out in U.S. Pat. No. 3,869,429. Specific examples of para-aramid materials are poly(p-phenylene terephthalamide) (PPD-T) and copoly(p-phenylene-3,4'-oxydiphenylene terephthalamide). Fibers of PPD-T are generally made by an air gap spinning process such as described in U.S. Pat. No. 3,767,756, and are preferably heat treated as described in U.S. Pat. No. 3,869, 430. Preferably, poly(p-phenylene terephthalamide)floc which has not been refined is utilized. High shear forces exerted on the fibers during processing, e.g., refining, may cause damage to the fibers and adversely affect the CTE of the reinforcement. It is also preferred to employ p-aramid floc of high orientation and relatively lower crystallinity. Fibrids are described in U.S. Pat. No. 4,729,921. To prepare the sheet, the floc and fibrids are dispersed in the desired proportions as an aqueous slurry, the solids concentration generally ranging between 0.005% and 0.02%. The slurry is not refined. The slurry can be made into paper by conventional means. In the examples mentioned in this patent, wet sheets were formed in an inclined wire Deltaformer papermaking machine and dried using heated drier cans. The dried sheets preferably had a basis weight between 0.8 and 4.0 oz/yd$^2$, and were then calendered between two hard-surface rolls. Calender pressures between about 500 and 2500 kg/cm (nip pressure) and roll temperatures between about 130 and 150 degrees C. were used. The paper was then pre-pregged with a resin having a high glass transition temperature (Tg.), e.g., above about 160 degrees C.

In U.S. Pat. No. 5,246,817, there is described one form of improvement in the manufacture of products such as PCBs. The manufacturing process in U.S. Pat. No. 5,246,817 consists of the sequential formation of layers using photosensitive dielectric coatings and selective metal deposition procedures. The first layer of the board is formed over a temporary or permanent carrier, which, if the latter, will become an integral part of the board. When the carrier is a circuit, the process comprises formation of a dielectric coating over the circuit with imaged openings defining the thru-holes. The imaged openings may be formed by exposure of a photosensitive dielectric coating to activating radiation through a mask in an imaged pattern, followed by a described development procedure. Alternatively, imaging may be by laser ablation, in which case, the dielectric material need not be photosensitive. Metal is deposited into the recesses within the dielectric coating to form the conductive thru-holes. Thereafter, an additional layer of dielectric material is coated onto the first dielectric layer, imaged in a pattern of circuit lines, and the recesses are then plated with metal. After imaging the first dielectric coating, it may alternatively be coated with a second dielectric coating and imaged and the recesses plated with metal to form the thru-holes and circuit lines simultaneously. By either process, the walls of the imaged opening or recesses in the dielectric coating contain metal as it deposits during plating and assures a desired cross-sectional shape of the deposit. Plating desirably fills the entire recess within the imaged photosensitive coating. The process, obviously very complex and costly, is repeated sequentially to form sequential layers of circuits and thru-holes.

"Expanded PTFE" dielectric materials represent another type of materials known for use in circuitized substrates, PTFE being the designate for polytetrafluoroethylene. A common example of such material is the aforementioned Teflon, sold by E. I. DuPont de Nemours and Company. In U.S. Pat. No. 5,652,055, for example, there is described an adhesive sheet (or "bond ply") material suitable to serve as adhesive layers in a variety of adhesive applications, such as in circuit board laminates, multi-chip modules, and in other electrical applications. The adhesive sheet is described as being constructed from an expanded PTFE material, such as that described in U.S. Pat. No. 3,953,566. Preferably, the material is filled with inorganic filler and is constructed as follows: Ceramic filler is incorporated into an aqueous dispersion of dispersion-produced PTFE. The filler in small particle form is ordinarily less than 40 microns in size, and preferably less than 15 microns. The filler is introduced prior to co-coagulation in an amount that will provide 10 to 60%, and preferably 40 to 50% by weight filler in the PTFE, in relation to the final resin-impregnated composite. The filled PTFE dispersion is then co-coagulated, usually by rapid stirring. The coagulated filled PTFE is then added. The filled material is then lubricated with a common paste extrusion lubricant, such as mineral spirits or glycols, and then paste extruded. The extrudate is usually calendered, and then rapidly stretched 1.2 to 5000 times, preferably 2 times to 100 times, per this patent, at a stretch rate of over 10% per second, at a temperature of between 35 degrees C. and 327 degrees C. The lubricant can be removed from the extrudate prior to stretching, if desired. The resulting expanded, porous filled PTFE is then imbibed with adhesive by dipping, calendaring, or doctor blading on a varnish solution of about 2% to 70% adhesive in solvent. The wet composite is then affixed to a tenter frame, and subsequently "B-staged" at or about 165 degrees C. for 1 to 3 minutes. The resulting sheet adhesive typically consists of: (a) 9 to 65 weight percent PTFE; (b) 9 to 60 weight percent inorganic filler, in the form of particulate; and (c) 5 to 60 weight percent adhesive imbibed within the porous web structure.

Other types of expanded-PTFE substrate materials are described in the aforementioned U.S. Pat. No. 3,953,566, and also in U.S. Pat. Nos. 4,187,390 and 4,482,516, as well as many others. U.S. Pat. No. 4,187,390 is particularly interesting because it delves substantially into both nodes and fibrils used as part of such substrate materials, breaking these down into such dimensional constraints as node height, node width, node length, and fibril length.

Other examples of methods of making circuitized substrates such as PCBs are described and illustrated in the several documents cited in the aforementioned co-pending application Ser. No. 10/812,890, the teachings of which, in addition to those other patents and applications listed above, are incorporated herein by reference.

The several examples of dielectric materials mentioned in many of the above patents are considered to have a limited usefulness as a substrate dielectric because of what can be referred to as high moisture absorptivity. That is, these dielectric materials tend to absorb what might be referred to as undesirable levels of moisture (a primary example being water) during processing and subsequent storage thereof. This unacceptable moisture results in the dielectric structure having unpredictable dimensional stability during processing and delamination, or blistering in the final component or board assembly process. By the term "high moisture absorptivity" as used herein is meant a level of moisture (water and other fluid materials, including other processing liquids and even gases to which the dielectric material is exposed during processing, storage and shipping) absorption greater than about 0.50 percent, as measured at a temperature of about 22 degrees C. for a time period of about 24 hours. A specific example used in the industry is when the dielectric layer is immersed in water at this temperature for this time period. An absorption level greater than about 0.50 percent is deemed unacceptable for the reasons given above.

The present invention as defined herein represents a significant improvement over products and processes such as those described above. One particularly significant feature of this invention is the provision of a composite layer including a first dielectric sub-layer including a plurality of fibers having a low coefficient of thermal expansion and a second dielectric sub-layer of a low moisture absorptivity resin not including continuous or semi-continuous fibers or the like as part thereof but instead including particulates. Both sub-layers include resins which are halogen-free, a particular advantage thereof being an excellent flame retardant rating. By the term "halogen-free" or "free of halogen" as used herein is meant a material not including bromine, chlorine, iodine or fluorine at concentrations not greater than two-thousand (2,000) parts per million (ppm). The invention is thus uniquely able to combine the significant advantages of fiber use, especially those relating to reinforcement, with a non-fibrous second sub-layer including a low moisture absorptivity resin, to produce a multilayered structure in which high density arrays of thru-holes are possible without, substantially, the aforementioned disadvantages associated with such fiber usage. By the term "low moisture absorptivity" as used herein to define the polymer resins used is meant a resin that absorbs less than about 0.5 percent by weight moisture at room temperature (22 degrees C.) for a period of 24 hours, while immersed in water. As understood from the following description, significant features of this invention include the provision of a composite layer including a first dielectric sub-layer which includes plurality of fibers having a low coefficient of thermal expansion for providing improved handling characteristics yet offering the advantage of being capable of being laser drilled so as to form relatively small, high aspect ratio thru-holes in the range of less than seventy microns in diameter with corresponding depths ("heights") as deep as about fifteen mils. Another of these features is the provision of a halogen-free resin that provides robust flame resistance, in one instance meaning that the resin has a UL-94 V0 rating, a known rating for resin materials such as those used in substrates.

It is believed that such an invention will represent a significant advancement in the art.

OBJECTS AND SUMMARY OF THE INVENTION

It is a primary object of the invention to enhance the art of circuitized substrates.

It is another object of the invention to provide a new dielectric material for use in a circuitized substrate which includes enhanced moisture adsorption properties to result in a dielectric layer which can be processed efficiently, utilizing the methods as taught and described herein.

It is another object to provide a new and unique method of making a circuitized substrate which is adaptable to current manufacturing procedures, utilizes the new dielectric material defined herein, and which is accomplished by more simplified usage thereof to thereby result in a product of reduced cost.

It is still another object of the invention to provide products adapted for utilizing circuitized substrates possessing the advantageous features defined herein.

According to one embodiment of the invention, there is provided a circuitized substrate comprising a composite dielectric layer including a first dielectric sub-layer including a plurality of fibers having a low coefficient of thermal expansion and a halogen-free resin, and a second dielectric sub-layer of a low moisture absorptivity resin and a quantity of inorganic particulates, said second dielectric sub-layer not including continuous or semi-continuous fibers or the like as part thereof, and at least one circuitized layer positioned on said composite dielectric layer.

According to another embodiment of the invention, there is provided a method of making a circuitized substrate, said method comprising providing a composite dielectric layer including a first dielectric sub-layer including a plurality of fibers having a low coefficient of thermal expansion and a halogen-free resin, and a second dielectric sub-layer of a low moisture absorptivity resin and a quantity of inorganic particulates, said second dielectric sub-layer not including continuous or semi-continuous fibers or the like as part thereof, and providing at least one circuitized layer on said composite dielectric layer.

According to yet another embodiment of the invention, there is provided a multilayered circuitized structure comprising a first circuitized substrate portion including a composite dielectric layer including a first dielectric sub-layer including a plurality of fibers having a low coefficient of thermal expansion and a halogen-free resin, and a second dielectric sub-layer of a low moisture absorptivity resin and a quantity of inorganic particulates, said second dielectric sub-layer not including continuous or semi-continuous fibers or the like as part thereof, and at least one circuitized layer positioned on said composite dielectric layer, and second and third circuitized substrate portions positioned on opposite sides of said first circuitized substrate portion, each having a second pattern of interconnecting thru-holes therein, said first circuitized substrate portion providing electrical interconnection between said second and third circuitized substrate portions, including interconnecting selected ones of said thru-holes in said second circuitized substrate portion with corresponding thru-holes within said third circuitized substrate portion.

According to still another embodiment of the invention, there is provided an information handling system comprising a housing, a circuitized substrate positioned substantially within said housing and including a composite dielectric layer including a first dielectric sub-layer including a plurality of fibers having a low coefficient of thermal expansion and a halogen-free resin, and a second dielectric sub-layer of a low moisture absorptivity resin and a quantity of inorganic particulates, said second dielectric sub-layer not including continuous or semi-continuous fibers or the like as part thereof and at least one electrical component positioned on and electrically coupled to said circuitized substrate.

BEST MODE FOR CARRYING OUT THE INVENTION

For a better understanding of the present invention, together with other and further objects, advantages and capabilities thereof, reference is made to the following disclosure and appended claims in connection with the above-described drawings. Like numbers will be used from FIG. to FIG. to identify like elements in these drawings.

By the term "circuitized substrate" as used herein is meant a structure comprised of at least one composite dielectric layer (which may include two or more dielectric sub-layers) and at least one circuit layer thereon. Such a "circuitized substrate", in its simplest form, may be used to electrically couple electronic components such as semiconductor chips, resistors, capacitors, etc. positioned thereon, as well as larger structures such as chip carriers, e.g., if the substrate is used as a PCB or the like on which the chip carrier itself is positioned and coupled.

By the term "circuitized substrate assembly" as used herein is meant a circuitized substrate having one or more electronic components thereon and electrically coupled thereto. Examples of such assemblies include PCBs (e.g., having a chip carrier thereon) and chip carriers (e.g., having one or more semiconductor chips coupled thereto).

"Information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include PCBs and other forms of circuitized substrates as part thereof, some including several such components depending on the operational requirements thereof.

Other definitions for many of the terms used herein, e.g., "thru-hole", "halogen-free" "high moisture absorptivity", "continuous" (for fibers), "low moisture absorptivity" etc. are also provided herein at appropriate locations.

As understood from the following and as discussed at least partly above, one key attribute of the present invention is the utilization of a dielectric composite material as part of the substrate which enables the provision of high density arrays of thru-holes within the substrate while substantially preventing electrical shorting or the like between closely spaced, adjacent holes. That is, very highly dense concentrations of relatively narrow (in diameter) holes are capable of being provided in this unique dielectric composite layer which can then be rendered conductive (typically, plated) to provide highly dense thru-hole circuit connections between designated conductive layers (e.g., signal, power and/or ground) within the final structure incorporating the circuitized substrate. As will be shown with the description below relating to the drawings, the aspect ratio of the thickness of the resulting circuitized substrate to the diameter of each of said thru-holes is within the range of from about 2:1 to about 20:1. It is possible, using the teachings of this invention, to provide as many as 10,000 thru-holes per square inch of the composite substrate, thus giving evidence of the high densities attainable using these teachings. Of further significance, the new dielectric material includes a first sub-layer of a halogen-free resin and a plurality of fibers with a low coefficient of thermal expansion (CTE), in combination with a sub-layer which includes a low moisture absorptivity resin with a quantity of inorganic particulates. The low moisture absorptivity second sub-layer does not include continuous or semi-continuous fibers therein. As explained, use of such fibers is often deleterious when producing substrates during the hole-forming and plating stages because of fiber or its material intrusion within the holes which can form a base for a conductive path to adjacent conductive holes. The composite layer of dielectric material as taught herein is substantially able to overcome such disadvantages while simultaneously taking advantage of the reinforcing properties of such fibers by virtue of placement thereof in a sub-layer format combined with another sub-layer not having same. The unique material taught herein is also able to overcome such associated fiber disadvantages while assuring a product with relatively high dielectric reliability in a relatively thin final composite layer, both features being highly desirable if the final product (e.g., chip carrier or PCB) using the substrate is to meet many of today's high density and miniaturization requirements. As mentioned above, the new dielectric material of the invention possesses low moisture absorption properties which are extremely beneficial because it provides for ease of processing (including during lamination when temperatures may exceed 245 degrees C.), including dimensional stability and coplanarity through such assembly processing. Layers including this material possess sufficient strength and durability to withstand the rigors, particularly the high temperatures and pressures, associated with lamination as conventionally utilized in the manufacture of PCBs. Also, the resulting product is produced using standard PCB manufacturing processes without any significant modification thereto, thereby keeping product costs down.

As stated, the dielectric material used to form the circuitized substrate of the various embodiments of the invention defined herein is in the form of a composite layer of dielectric material which includes two sub-layers of dielectric as part thereof, which are bonded together (e.g., using lamination) to form the composite. One sub-layer, referred to herein as a first dielectric sub-layer, is comprised of a halogen-free resin, preferably of a high Tg (glass transition temperature) thermosetting polymer. In one embodiment, the dielectric resin material is a halogen-free benzoxazine type family polymer formulated as a seventy per cent by weight solids solution in methyl ethyl ketone. This resin has a visual appearance of amber liquid, with a viscosity of 500-3000 cPs at twenty-five degrees C. and a specific gravity in solution form of approximately 1.13 g/cc. After curing, the resulting thermosetting polymer can exhibit a glass temperature in the range of 200-250 degrees C. This resin can be enhanced by the addition of secondary type additives of the epoxy cresol novolac type and having an epoxy equivalent weight of about 200-400, a softening point of about seventy-five to about eighty-five degrees C. and a functionality rating in the range of approximately 5.1. An alternative to this resin can be a polymer of dicyclopentadiene concentrate, phenol and epichlorohydrin, having a specific gravity of approximately 1.16 at twenty degrees C., a functionality of about 3.2 and a softening point in the range of about eighty to about ninety degrees C. Another alternative is a halogen free and highly enriched nitrogen thermosetting resin from the bis-maleimide triazine family, having a twenty to forty percent advancement and being available in methyl ethyl ketone solution at seventy-two percent solids content.

A third additive usable in this invention is a white, fine-grained powder based on an organic phosphinate and having a high phosphorous content, this additive providing desired flame retardancy without the need for brominated compounds. This is not hygroscopic and is insoluble in water and common organic solvents like acetone, dichloromethane, MEK and toluene. It can easily be easily be dispersed in solvents like acetone or MEK, has a phosphorous weight percentage of approximately twenty-three percent, a water/moisture weight percentage of approximately 0.5, a density of approximately 1.35 gm/cm$^3$ at twenty degrees C., a bulk density of about 100-200 kg/M$^3$, a decomposition temperature of greater than 300 degrees C., and a particle size distribution within the range of approximately D50 (<approx. ten microns) and D95 (<approx. twenty microns).

A fourth additive usable in the present invention is a class of melamine, melamine homologous and melamine polyphosphate compounds. Melamine (2,4,6-triamino-1,3,5triazine, CAS nr. 106-78-1) is a white crystalline powder with a melting point of approximately 354 degrees C. and a density of 1.573 grams/cc. Far below its melting point, already at >200 degrees C., melamine is known to vaporize or sublime (diluting the fuel gases and oxygen near the combustion source). When sublimating, it absorbs an amount of heat of about 29 k-cal/mole, and, when decomposing, it absorbs an amount of heat of ~470 kcal/mole. This additive thus acts as a heat sink in high temperature conditions. Additionally, melamine exhibits low solubility in water and most other solvents, excellent UV absorption above 250 nm and a pH of 8.1. Melamine cyanurate is a salt of melamine and cyanuric acid, has a higher thermal stability than pure melamine (remaining stable up to about 320 degrees C.). Above 320 degrees C., it undergoes endothermic decomposition to melamine and cyanuric acid, thus acting as a heat sink in the process. The vaporized melamine acts as an inert gas source diluting the oxygen and the fuel gases present at the point of combustion. Melamine phosphates combine the synergistic effect of melamine (thus N-containing) with P-containing components in one salt. With increasing thermal stability, the melamine phosphates can be ranked as follows: Melamine Phosphate<Melamine Pyrophosphate<Melamine Polyphosphate. Melamine-mono-phosphate, is a salt of melamine and phosphoric acid. Above18 200 degrees C. melamine phosphate will react to melamine pyro-phosphate with release of reaction water, which will also result in a heat sink. Above 350 degrees C., melamine-polyphosphate undergoes endothermic decomposition, thus acting as a heat sink and cooling the combustion source. The released phosphoric acid acts to coat and therefore shield the condensed combustible polymer. The phosphoric acid along with the polymer also works to form a char around the fuel source (polymer) thus reducing the amount of oxygen present at the combustion source. The melamine released also is a blowing source to blow up the char resulting in an intumescent behavior. Nitrogen content ranges from about forty-two to about forty-four percent, phosphorous content about twelve to about fourteen percent, water content a maximum of about 0.3 weight percent, particle size in the range of from about D99 (maximum of seventy microns), a pH of approximately five and a specific gravity of 1.85 g/cm3. Melamine homologues (melam, melem, melon) have higher thermal stability compared to pure melamine and melamine cyanurate. If processing temperatures are well above the temperature range of Melamine Cyanurate (320 degrees C.) this may result in mould deposit. Melamine homologues offer an alternative nitrogen source that can be used under such extreme conditions. Melam, melem and melon are believed to act in general in the same way as melamine, but at higher temperature. Melam (1,3,5-triazine-2,4,6-triamine-n-(4,6-diamino-1,3,5-triazine-2-yl) is a fine, light white-grey powder having a thermal decomposition at 400 degrees C. Melem (-2,5,8-triamino1,3,4,6,7,9, 9b-Heptaazaphenalene) is a fine, light yellow powder with a thermal decomposition at approximately 500 degrees C. Melon (poly[8-amino-1,3,4,6,7,9,9b-Heptaazaphenalene-2, 5-diyl] imino is a fine yellow powder with a melting point. and thermal decomposition above 500 degrees C., a specific gravity of about 1.686 g/c$^3$ at twenty degrees C., and a bulk density of about 500 kg/m$^3$.

Optionally, a halogen-free, high molecular weight, reactive thermoplastic resin may be used, including in combination with the above first-identified resin material. This material will impart toughness and coating flake-off resistance. Such a resin may have a specific gravity of 0.965, a solid weight percent of about 39-41, a boiling point of 80 degrees C., and, importantly, a viscosity within the range of about 4500 to 7000 centipoises (cp) at 25 degrees C. If used on combination with another resin, this second resin may comprise from about 3 percent to about 25 percent by weight of the total resin composition and about 1.5 percent to about 12.5 percent of the total first sub-layer volume. It is also possible for the second resin to be used on its own as the sole resin material in the final composition. This first sub-layer resin is also preferably of the low moisture absorptive type.

Catalysts for the resin composition of the first sub-layer may include amines such as the imidazoles, tertiary amines such as benzyldimethylamine, 1,3-tetramethyl butane diamine, tris (dimethylaminomethyl) phenol, pyridine, and triethylenediamine, and acidic catalysts, such as stannous octoate. A solvent such as methyl ethyl ketone may be added to dissolve the various resins and permit coating of the selected carrier. Finally, a coupling agent (one example being a silane such as Dow-Corning Z-6040, available from Dow-Coming Corporation, Midland, Michigan) may be added to improve web to resin interfacial adhesion. This particular silane from Dow-Corning contains reactive glycidoxy and methoxy groups and, significantly, reacts with (or "couples") organic polymers and inorganic surfaces. It is a low viscosity fluid with a specific gravity of 1.07 at 25 degrees C. It is designated 3glycidoxypropyltrimethoxy-silane and is one of a series of organofunctional silane chemicals from the Dow-Corning Corporation. The halogen-free resin of the first sub-layer preferably has less than 0.27% moisture absorption when the sub-layer is immersed in water for a period of about 24 hours at a temperature of about 22 degrees C. In one embodiment, the resin content of this first sub-layer may comprise from about 10 to about 80 percent by weight of the sub-layer.

This first sub-layer further includes fibers having a low CTE to influence the ultimate CTE for the combined composite dielectric structure. In one embodiment, the fibers are of non-woven aramid material of the semi-continuous type and are randomly distributed in the x-y plane and fused or held together with a binder to form a matte, which then has the halogen-free resin bonded thereto. A more specific aramid fiber for use here are p-aramid (poly(p-phenylene terephthalamide) fibers comprised of Kevlar (Kevlar is a trademark of E. I. duPont de Nemours and Company), with a dielectric constant of approximately 4.0 (as compared to a higher 6.1 for standard fiber-glass cloth such as with for "FR4" dielectric materials known in the art. The lower permittivity of the non-woven aramid reinforcement provides for faster signal propagation, allowing increased wiring density and less crosstalk, which becomes increasingly important for high I/O chips and miniaturization. Since the p-aramid fibers are transversely isotropic and have an axial CTE of about −3 to about −6 ppm/degrees C. below the glass transition temperature when combined with a thermosetting resin, the final composite will possess a CTE which can be controlled and adjusted to match that of silicon or semiconductor chips in the range of about 3 to about 19 ppm/degrees C. This is a significant feature of this invention, especially when comparing to conventional circuit boards using glass fabric which have CTE's in the much higher range of about 16 to about 24 ppm/degrees C. Having the fibers as part thereof, the coefficient of thermal expansion (CTE) of this first sub-layer is low, preferably about 8 to 12 ppm per degrees C. in both x and y directions. Alternatives to this reinforcing layer could be other films made up from polyimides or liquid crystalline materials.

The second sub-layer of the dielectric composite layer also includes a halogen-free resin, preferably similar to the resin in the first sub-layer, but, most importantly, does not include any fibers therein. This resin must be a low moisture absorptive resin. Instead of fibers, this second sub-layer includes a quantity of inorganic particulates mixed therein. Optionally, inorganic fillers may be utilized as particulate material in combination with the aforementioned low moisture absorptivity resin for the second sub-layer, these fillers preferably in volume ranges from about 10% by volume to about 80% percent by volume of the total resulting dielectric second sub-layer's volume. Examples of such inorganic fillers include Tatsumori PLV-6 and PLV-4 fillers, available from Tatsumori, Tokyo 105 Japan. Preferably, the particle size for this silica is less than ten microns.

Another preferred example of such particulate material is thixotropic-silica, sold under the product name Aerosil R-972 by Degussa Corporation of Teterboro, N.J. Aerosil R-972 silica is a hydrophobic amorphous fumed silica having a melting point of 1,700 degrees C., a specific gravity of 2.2, and a pH of about 3.6-5.0, and can be added to achieve an improved balance between the solution viscosity of the solvent containing coating varnish and the melt viscosity of the B-staged (see more below) dielectric coating. The particles of these fillers each preferably have a size within the range of about 200 Angstroms to about 15 microns, one size which is possible being only about five microns. The above ranges are not meant to limit the invention, as others are acceptable for use in the present invention. Other thermally conductive and electrically insulating fillers could be used for improving the thermal heat transfer from the device to the surroundings. Such fillers include aluminum oxide, 92% alumina, 96% alumina, aluminum nitride, silicon nitride, silicon carbide, beryllium oxide, boron nitride and diamond powder (made with either high pressure or a plasma CVD process). Especially preferred of these fillers are boron nitride and aluminum nitride because of the high thermal conductivity thereof.

The preferred particulate material can be optionally pretreated with a coupling agent, such as γ amino propyl triethoxy silane (A1100), β-(3,4-epoxy cyclohexyl) ethyltrimethoxy silane (A186), or the aforedescribed γ-glycidylpropyltrimethoxy silane (Z-6040) from Dow-Corning. An amount of this coupling agent which is about 0.25% by weight of particulate has been found to be satisfactory. The amount should not be more than about a few monolayers. The particles as used provide low expansion for the final layer in comparison to a resin material not including same. Of further significance, the particles assure a finished second sub-layer composite structure which has a relatively low isotropic expansion in the 25-35 ppm (parts per million)/degrees Celsius (C) thermal expansion range. Further, the particles provide fracture and fatigue resistance, relatively low moisture absorption and a roughened surface texture sufficient to facilitate subsequent plating (especially with copper) on the formed thru-hole and other, e.g., external, surfaces. The addition of specific volume percentages of particles thus allows the product manufacturer to adjust the coefficient of thermal expansion (CTE).

Dielectric composite layers produced using the above sub-layer materials may possess the following key electrical, thermal, physical and thermal expansion properties, as defined by process development analyses. Sub-layer 1 is understood to be the sub-layer with fibers having the defined low CTE, while sub-layer 2 is understood to be the sub-layer with the halogen free and low moisture absorptivity resin and particulates, but no fibers. These properties are:

|  | Sub-layer 1 | Sub-layer 2 |
|---|---|---|
| Electrical Properties | | |
| Dielectric constant (Dk) at 1-2.5 GHz | 3.24-4.06 | 3.2-3.7 |
| Loss factor at 1 MHz | 0.08-0.0114 | 0.085-0.0101 |
| Thermal Properties | | |
| Tg (DSC mid point) (degrees C.) | 208-224 | 209-215 |
| Decomposition Temperature (degrees C.) | 356-402 | 354-400 |
| Thermal Expansion | | |
| Below Tg (ppm/degrees C.) | 8-17 | 26-35 |
| Above Tg (ppm/degrees C.) | 150-230 | 90-115 |
| Physical Properties | | |
| % moisture, after 24 hours | 0.42-0.76 | 0.35-0.48 |
| Burn Time (seconds) | 3-8 secs | 4-7 secs |
| Burn Length (inches) | 1.0-2 in | 1.0-2 in |

The resulting composite dielectric structure (or free-standing film) of finally cured resin material and fiber-containing sub-layer has low moisture absorptivity, making it very unique as a substrate for PCBs and chip carriers. Equally important, this composite layer and additional similar composite layers, when staged as defined, are then readily receptive to subsequent circuitization processing using conventional photolithographic processing. In a preferred embodiment, the desired circuitry is formed of copper and applied using such processing. Photolithographic processing of substrates of this type is well known in the PCB field and further description is not deemed necessary.

It has been discovered that when drilling (e.g., typically using a laser, described below) thru-holes in the above composite material, highly dense concentrations of such hole patterns are attainable without, surprisingly, electrical shorting of the holes after plating of the sidewalls thereof has occurred. That is, the plating material (typically copper) does not migrate from thru-hole to thru-hole, as occasionally occurred when continuous and/or semi-continuous fiberglass and other fibrous materials were utilized in earlier dielectric compositions. In one embodiment of the invention, as mentioned above, it was possible to drill a total of 10,000 holes within one square inch of dielectric layer, representing an extreme example of the high density hole patterns attainable using the unique teachings herein. Pattern densities ranging from about 500 holes per square inch to about 10,000 holes per square inch are attainable using the present invention's teachings. As stated, a laser is preferably used for such drilling, and in particular, a YAG laser, which may operate at speeds of 20-50 thru-holes per second, each hole having a two mil diameter and extending through the dielectric layer. This laser is also capable of providing up to 250 thru-holes per second with the resulting holes having similar diameters but extending only partly into the dielectric layer (also referred to as "blind vias" as mentioned above).

As further understood from the description herein, a particular use for the circuitized substrate formed herein is as part of a chip carrier or a PCB or other electronic packaging product such as those made and sold by the Assignee of the instant invention. One particular example is a chip carrier sold under the name Hyper-BGA chip carrier (Hyper-BGA being a registered trademark of the Assignee, Endicott Interconnect Technologies, Inc.). The invention is of course not limited to chip carriers or even to higher level PCBs. It is also understood that more than one such circuitized substrates (e.g., those each also referred to as a "core", a specific example being what is referred to as a "power core" if the core includes one or more power planes and is thus to serve primarily in this capacity) may be incorporated within such a carrier or PCB, depending on operational requirements desired for the final product. As defined below, the "core" can be readily "stacked up" with other layers, including conductors and dielectric, and bonded together (preferably using conventional PCB lamination processing) to form a much thicker, multilayered carrier or multilayered PCB. The laminate so formed is then subjected to further processing, including conventional photolithographic processing to form circuit patterns on the outer conductive layers thereof. As described herein-below, such external patterns can include conductive pads on which conductors such as solder balls can be positioned to connect the structure to other components such as semiconductor chips, PCBs and chip carriers if so desired. The unique teachings of this invention are thus adaptable to a multitude of electronic packaging products. Significantly, the invention enables incorporation of the circuitized substrate (e.g., if a dense "core") with its highly dense thru-hole patterns and interconnection capabilities within a larger multilayered structure in which the other layered portions do not possess such densification and operational capabilities. Thus, a "standard" multilayered product can be produced for most of its structure and the unique subcomponent taught herein simply added in as part of the conventional processing of such a "standard". If the circuitized substrate core is internally positioned, it enables highly dense connections between other, less dense portions of the multilayered product, thus giving said product the unique capabilities of the invention in at least a portion thereof.

Figure 1:
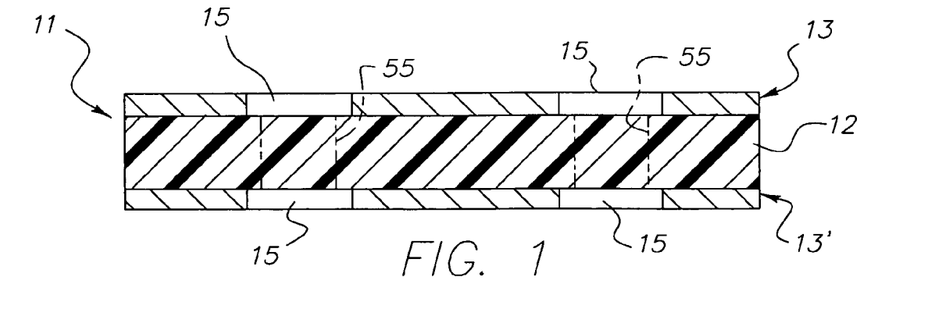
FIGS. 1-5 represent steps utilized to produce a circuitized substrate in accordance with one embodiment of the invention.

In FIG. 1, one example of an initial step in forming a circuitized substrate as taught herein is shown. In this step, a first dielectric sub-layer 11 is formed. Sub-layer 11 includes a dielectric layer 12 comprised of halogen-free resin (as defined above) and a plurality of fibers (also defined above) having a low CTE dispersed therein. Conductive layers 13 and 13' (both preferably copper) are bonded to sub-layer 11, on opposite sides thereof as shown. A single side application is also possible, however. Dielectric layer 12 has an initial thickness of from about one to about six mils while each copper layer 13 and 13' is only from about seven to eighteen microns thick. Layers 13 and 13' are preferably laminated onto the opposite sides of layer 12 using conventional PCB lamination processing. Following lamination, sub-layer 11 includes a thickness of about three to seven mils. In a next step, layers 13 and 13' are "personalized", resulting in the formation of a plurality of openings 15 in aligned orientation on the opposite sides, as shown. In this particular embodiment, these openings will serve as clearance holes, as better understood from the following description. Conventional PCB photolithographic processing may be used to form the openings, and further description is not considered necessary. In one example, each opening 15 has a diameter of about four to eight mils, and, in one embodiment, as many as 10,000 such openings may be provided per square inch of surface area of each conductive layer. In addition, it is also within the scope of the invention to provide additional circuit features such a lines and/or pads (not shown) within one or both layers 13 and 13'. If sub-layer 11 is to eventually serve as part of a "power core", layers 13 and 13' will typically only include openings 15 therein. However, if one or both layers 13 and 13' are to function in another capacity, e.g., as a signal layer, then other patterns may be provided. The patterns in FIG. 1 are thus not meant to limit the scope of the invention. The dielectric layer 12, including the defined resin as part of the composition, is preferably in what is known in the art as at "B-stage", meaning that it has only partly cured but not fully.

Figure 2:
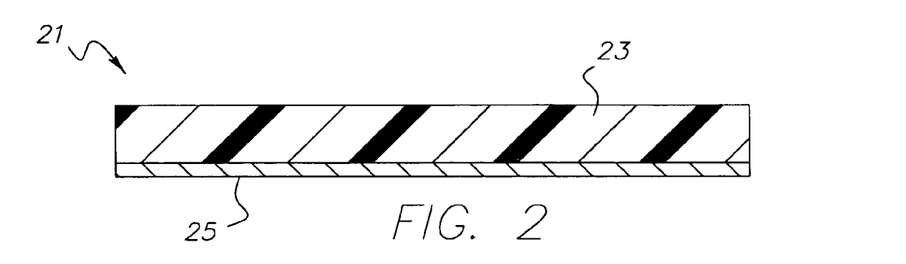

In FIG. 2, there is shown a second dielectric sub-layer 21 for use in the invention. Sub-layer 21 includes a dielectric layer 23 of low-moisture absorptivity, halogen-free resin (as defined above) and a quantity of inorganic particulates (as also defined above) dispersed therein. Unlike dielectric layer 12 in FIG. 1, however, dielectric layer 23 does not include any fibers, continuous or semi-continuous, therein, for the reasons stated above. In one embodiment, layer 23 has an initial thickness of from about one to about four mils and is deposited on a conductive layer 25, preferably copper, by a coating process. Layer 25 has a thickness similar to layers 13 and 13', about twelve to eighteen microns. The preferred coating procedure for applying the dielectric layer 23 is a reverse roll coating process using a dispersion of the materials having a viscosity in the range of 600 to 1400 cps. The preferred solvent for coating is methyl ethyl ketone. The coating, following drying (and being partially advanced), has a glass transition temperature within the range of about forty-three to about sixty-five degrees C. The resulting thickness for sub-layer 21 is about one to about three mils, and, as with layer 12 above, layer 23 is preferably at "B-stage." In a preferred embodiment, two such sub-layers 21 are formed.

Figure 3:
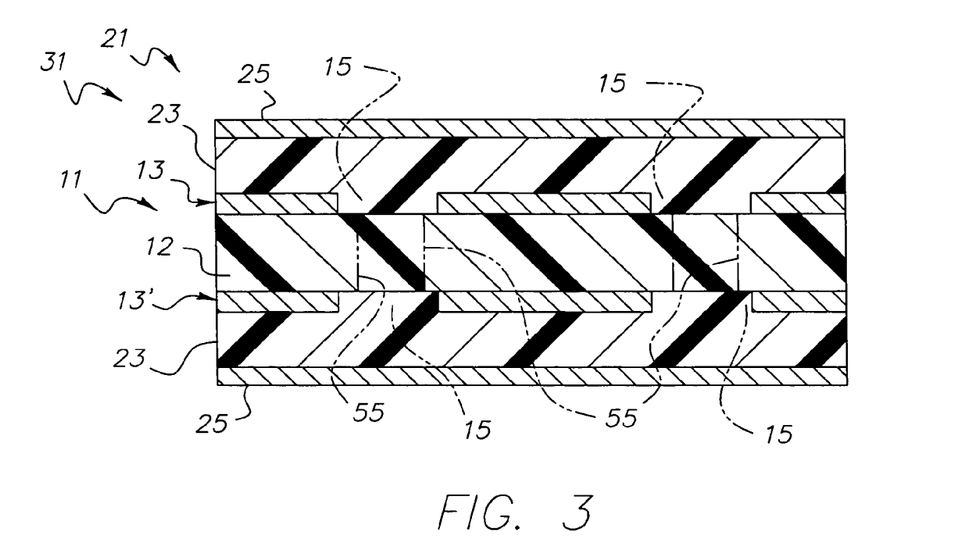

Each of the two second sub-layers 21 is aligned with the first sub-layer 11 with the dielectric layer facing sub-layer 11 and all three sub-layers are then bonded together using conventional PCB lamination processing. In one example, a total pressure of about 400 pounds per square inch (PSI) was used, at a temperature of about 220 degrees C., for a period of about ninety minutes. The result is a laminated, composite layer structure 31 (FIG. 3) having outer conductive layers 25 and the two internal conductive layers 13 and 13' (with clearance openings 15). Significantly, the dielectric material from layers 23 substantially fills each of the openings 15 as a result of the laminating heat and pressure. This is an important aspect of the invention, as understood from the following. The resulting composite 31 as shown in FIG. 3 may possess a thickness of about nine to about twelve mils. The dielectric layers 12 and 23 of this structure are also in what is referred to in the art as a "C-stage" state, meaning that cure has been substantially completed. Significantly, the FIG. 3 structure, with the combined sub-layers 11 and 21, the inner conductive layers 13 and 13', and the two outer conductive layers 25, may serve as is as a circuitized substrate, or, may function to serve as part of the larger, multilayered structure, as explained below. Composite 31 may also be further modified, for either of these purposes, as defined with the FIG. 4 embodiment. If part of a larger substrate product, the composite 31 may serve as what is also referred to in the art as a "core" substrate, one example being a power core, e.g., if conductive layers are power planes in the finished product. Typically, however, layers 25 will function as signal layers.

Figure 4:
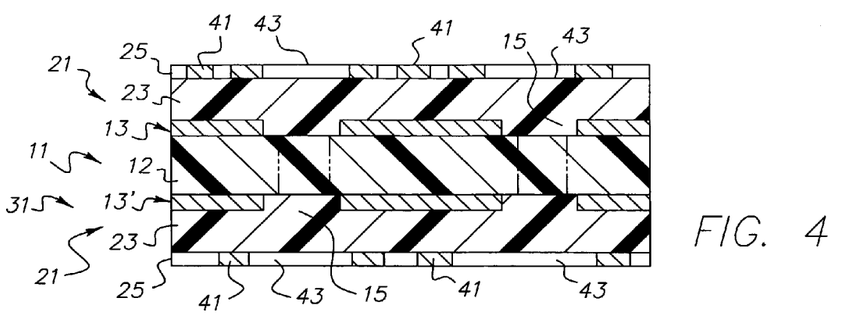

In FIG. 4, the outer conductive layers 25 are "personalized", again preferably using conventional photolithographic processing as used for layers 13 and 13'. In one embodiment, layers 25 will include a plurality of signal lines 41 (shown in cross-section), but these elements may also be conductive pads, depending on the desired final use thereof. Significantly, openings 43 are also formed within layers 25 as part of this process, these openings 43 aligning with respective ones of the internal openings 15 in conductive layers 13 and 13'. Such "personalizing" is performed if layers 25 are to serve as signal planes in the final product, or, if the FIG. 4 structure is to be used as is, to form pads or the like for coupling to external connection elements such as component leads or solder balls. In the embodiment defined herein, structure 31 is preferably to form part of a larger multilayered structure, so layers 25 will serve as signal planes.

Figure 5:
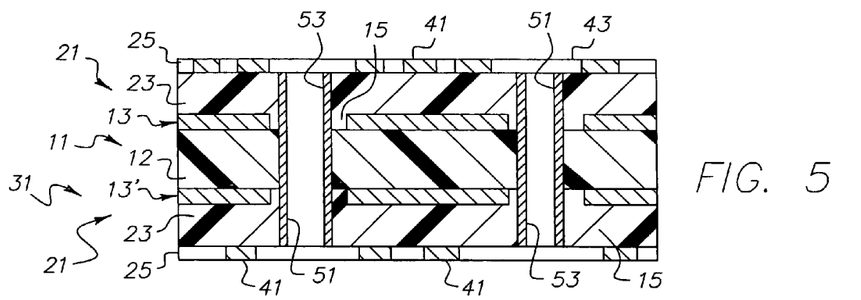

In FIG. 5, openings 51 are formed within composite 31, extending from the one outer surface (upper) thereof to the other, lower surface. In one embodiment, one opening is formed for each aligned pair of internal clearance holes (15) within sub-layer 11. Openings 51 may include a diameter of two mils or less and are formed using laser drilling, e.g., a YAG laser. Should lesser density patterns of such openings be desired, it is also possible to form the openings using mechanical drills. Following formation of openings 51, the walls of the openings are plated with a conductive metallurgy 53, preferably copper or copper alloy, using conventional electroplating processing known in the PCB art. In one embodiment, the layers of this metallurgy may have a thickness of only about 0.5 to about 2.0 mils. The result is the formation of thru-holes in a highly dense pattern, each thru-hole extending, as mentioned, through the entire composite 31 thickness. Like the composite of FIGS. 3 and 4, the composite in FIG. 5 is also a circuitized substrate and may serve as a stand alone substrate, e.g., a chip carrier, or, as mentioned, as a "core" structure to be used in combination with other conductive and dielectric layers, including with other similar circuitized substrates, in a larger, multilayered structure. The addition of the thru-holes enables the substrate of FIG. 5 to function with greater interconnecting capabilities, of course, and thus makes this particular version of the invention more desirable in meeting today's more demanding functional requirements.

It is important to note that connectivity is enhanced significantly in the FIG. 5 embodiment due to the presence of the dielectric 23 from the sub-layers 21 within openings 15, due to the absence of any fibers in this dielectric. That is, the plated metallurgy 53 is only applied onto fiber-free dielectric within the confines defined by openings 15. Any chances for undesirable fibrous-type electrical connections as mentioned above between metallurgy 53 and the conductive layers 13 and 13' is thus substantially eliminated. This is an important feature of the invention because it enables high-density connections while assuring prevention of electrical shorts at locations within the final product. Understandably, such electrical shorting could render the product inoperable for its intended purpose.

As an alternative to the embodiment defined above, it is also possible to form other openings within the composite earlier than as shown in FIG. 5. Specifically, openings could be formed within the sub-layer 11 prior to bonding with the two sub-layers 21 in FIG. 2, such that the dielectric 23 of the second sub-layers would then flow into these openings during lamination to the first sub-layer. Such openings are shown in phantom and represented by numerals 55 in both FIGS. 1 and 3, and in the FIG. 3 embodiment, are understood to include the dielectric 23 therein. As such, subsequent formation of openings 51 through the composite in FIG. 5 will result in these openings extending entirely through the fiber-free dielectric material. The possibility for undesirable fiber-type connections is even further prevented by this structure.

Figure 6:
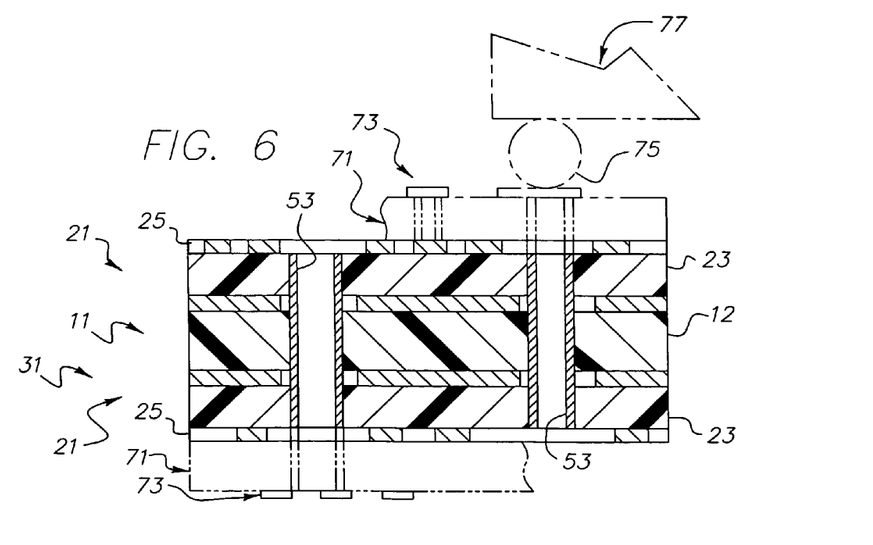
FIG. 6 illustrates additional layers and elements which may be added to the structure of FIG. 5, if desired.

In FIG. 6, there is shown the addition of further dielectric layers 71 (in phantom) on opposite sides of the composite 31, and an additional conductive layer 73 (also in phantom) on each of these added dielectric layers. FIG. 6 is intended to represent the fact that several additional dielectric and conductive layers may be added to the FIG. 6 structure to form a thicker multilayered final product such as a PCB or laminate chip carrier having more than the number of layers shown in FIGS. 3-5. As stated, it is also possible to incorporate more than one such internal circuitized substrate "core" such as shown in FIG. 6 within such a larger, thicker structure to thus afford the final structure with the teachings of the invention at more than one location therein. To this end, the embodiment of FIG. 5, as also stated, can also be considered such a "core." Finally, it is also within the scope of the invention to utilize two or more of the FIG. 5 structures only to form a multilayered composite (circuitized substrate assembly), utilizing known "sticker sheet" dielectric layers between each aligned pair during lamination thereof into the final structure. Whichever the choice, the thru-holes in each of the now "sub-composites" may be interconnected electrically, thereby providing conductive paths through selected portions of the final circuitized substrate assembly structure, including through the entire structure itself, if desired. If, for example, three now "sub-composites" of the type shown herein are combined to form a multilayered final structure (e.g., a multilayered PCB), then it is clear that the thru-holes of the interim sub-composite will provide electrical interconnection, once rendered conductive such as by the afore-defined plating operation, between the thru-holes of the two outer sub-composites bonded on opposite sides of this interim sub-composite.

In addition to the added dielectric and conductive layers, it is also possible to couple electrical components to the FIG. 6 structure, one example of forming such a connection being to use a solder ball 75 (phantom) which connects the structure to an electrical component such as a semiconductor chip or chip carrier, both represented by the numeral 77, and also shown in phantom. Components may be coupled to both sides of the multilayered structure in FIG. 6. The FIG. 6 structure is thus understood to be a circuitized substrate assembly including a circuitized substrate and at least one electrical component electrically coupled thereto and forming part thereof.

Figure 7:
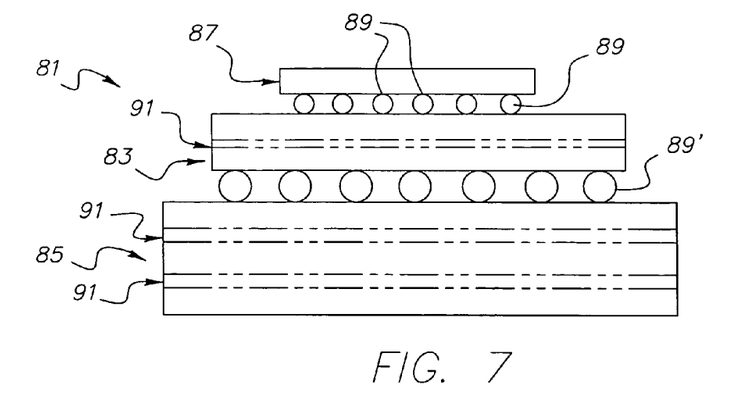
FIG. 7, on a much smaller scale than FIGS. 1-6, illustrates an electrical assembly which may utilize one or more of the circuitized substrates defined herein and made in accordance with the teachings herein.
Figure 8:
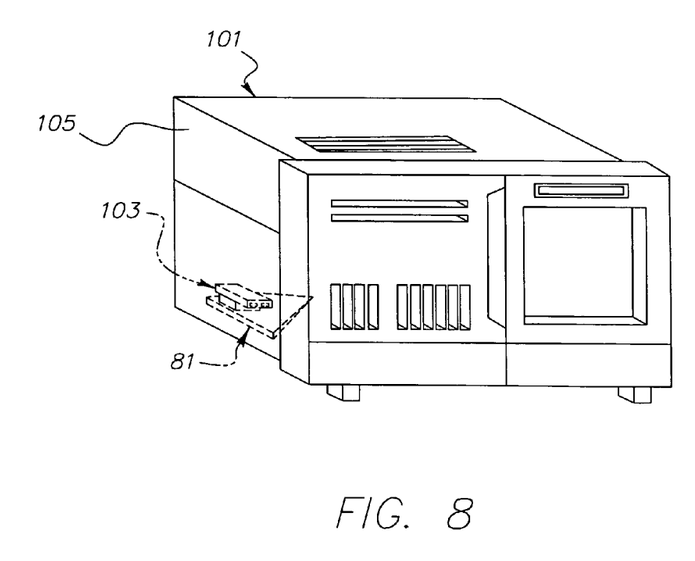
FIG. 8 represents an information handling system according to one aspect of the invention which is capable of utilizing one or more of the circuitized substrates taught herein.

As stated, each circuitized substrate formed in accordance with the teachings herein may be utilized within a larger substrate of known type such as a PCB, chip carrier or the like. FIG. 7 illustrates two of these larger components, one being a chip carrier 83 and the other a PCB 85, the carrier positioned on and coupled to the PCB and thereby forming an electrical assembly 81. PCB 85 may be positioned within and electrically coupled to an information handling system as shown in FIG. 8, which may be in the form of a personal computer, mainframe, computer server, etc. Chip carrier 83, as shown, is typically positioned on and electrically coupled to an underlying substrate such as PCB 85. Such a carrier also typically has a semiconductor chip 87 mounted thereon and also electrically coupled to the carrier. In the embodiment of FIG. 7, the connections between chip and carrier and between carrier and PCB are accomplished using solder balls 89 and 89', respectively. Such connections are known in the art and further description is not considered necessary. The significance of FIG. 7 is to show the use of one or more of the circuitized substrates 91 (in phantom) of the invention in the chip carrier 83 and PCB 85, thus forming part thereof. Two substrates 91 are shown as used within PCB 85, while only one is shown within carrier 83. As mentioned above, the invention is not limited to the numbers shown. For example, three or more substrates 91, each forming a particular circuitized "core" (e.g., a "power core") within the PCB, may be utilized to afford the PCB the highly advantageous teachings of the invention. Or, as stated, the entire PCB or chip carrier laminate may be comprised of circuitized substrates as taught here. Many different combinations are thus possible.

In FIG. 8, there is shown an information handling system 101 in accordance with one embodiment of the invention. System 101 may comprise a personal computer, mainframe computer, computer server, or the like, several types of which are well known in the art. System 101, as taught herein, may include one or more of the electrical assemblies as shown in FIG. 7, including both PCB 85 and carrier 83, these being represented by the numeral 103 in FIG. 8. This completed assembly, shown hidden, may be mounted on still a larger PCB or other substrate (not shown), one example being a "motherboard" of much larger size, should such a board be required. These components are shown hidden because these are enclosed within and thus behind a suitable housing 105 designed to accommodate the various electrical and other components which form part of system 101. PCB 85 may instead comprise such a "motherboard" in system 101 and thus include additional electrical assemblies, including additional printed circuit "cards" mounted thereon, such additional "cards" in turn also possibly including additional electronic components as part thereof. It is thus seen and understood that the electrical assemblies made in accordance with the unique teachings herein may be utilized in several various structures as part of a much larger system, such as information handling system 101. Further description is not believed necessary.

While there have been shown and described what are at present considered to be the preferred embodiments of the invention, it will be obvious to those skilled in the art that various changes and modifications may be made therein without departing from the scope of the invention as defined by the appended claims.

What is claimed is:

1. A circuitized substrate comprising:
   a composite dielectric layer including a first dielectric sub-layer including a plurality of fibers having a low coefficient of thermal expansion and a halogen-free resin, and a second dielectric sub-layer of a low moisture absorptivity resin having a moisture absorption less than 0.50% when immersed in water for a period of about 24 hours at a temperature of about 22 decrees C. and a quantity of inorganic particulates, said second dielectric sub-layer not including continuous or semi-continuous fibers as part thereof; and
   at least one circuitized layer positioned on said composite dielectric layer, said circuitized substrate having no flammability.

2. The circuitized substrate of claim 1 wherein said low moisture absorptivity resin of said second dielectric sub-layer of said composite dielectric layer comprises a high Tg thermosetting polymer and is also halogen-free.

3. The circuitized substrate of claim 1 wherein said quantity of inorganic particulates of said second dielectric sub-layer are comprised of silica.

4. The circuitized substrate of claim 3 wherein the particle size of said particulates are less than fifteen microns.

5. The circuitized substrate of claim 1 wherein said halogen-free resin of said first dielectric sub-layer of said composite dielectric layer is also a low moisture absorptivity resin.

6. The circuitized substrate of claim 5 wherein said low moisture absorptivity resin of said first dielectric sub-layer of said composite dielectric layer comprises a high Tg thermosetting polymer.

7. The circuitized substrate of claim 1 wherein said first dielectric sub-layer of said composite dielectric layer has a coefficient of thermal expansion in the x and y direction less than about seventeen ppm per degree C.

8. The circuitized substrate of claim 1 wherein said plurality of fibers of said first dielectric sub-layer having a low coefficient of thermal expansion are p-aramid fibers in the form of a matte.

9. The circuitized substrate of claim 8 wherein said p-aramid fibers in the form of said matte have a dielectric constant of about 3.4.

10. The circuitized substrate of claim 1 wherein said first and second dielectric sub-layers of said composite dielectric layer each include a plurality of thru-holes therein, the aspect ratio of the thickness of said circuitized substrate to the diameter of each of said thru-holes being within the range of from about 2:1 to about 20:1.

11. The circuitized substrate of claim 1 wherein said at least one circuitized layer is comprised of copper.

12. The circuitized substrate of claim 1 further including a second circuitized layer positioned on said composite dielectric layer on a side opposite said at least one circuitized layer.

13. The circuitized substrate of claim 12 further including second and third dielectric layers positioned on said at least one circuitized layer and said second circuitized layer, respectively, and third and fourth circuitized layers formed on said second and third dielectric layer, respectively.

14. The invention of claim 13 wherein said circuitized substrate comprises a chip carrier.

15. The circuitized substrate of claim 1 further including at least one electrical component positioned on and electrically coupled to said circuitized substrate, said circuitized substrate and said at least one electrical component forming a circuitized substrate assembly.

16. The circuitized substrate of claim 15 wherein said electrical component comprises a semiconductor chip.

17. The circuitized substrate of claim 15 wherein said electrical component comprises a chip carrier.

18. The circuitized substrate of claim 1 wherein said first dielectric sub-layer of said composite dielectric layer has no more than 0.27% moisture absorption when the sub-layer is immersed in water for a period of about 24 hours at a temperature of about 22 degrees C.

19. A multilayered circuitized structure comprising:
a first circuitized substrate portion including a composite dielectric layer including a first dielectric sub-layer including a plurality of fibers having a low coefficient of thermal expansion and a halogen-free resin, and a second dielectric sub-layer of a low moisture absorptivity resin having a moisture absorption less than 0.50% when immersed in water for a period of about 24 hours at a temperature of about 22 degrees C. and a quantity of inorganic particulates, said second dielectric sub-layer not including continuous or semi-continuous fibers as part thereof, and at least one circuitized layer positioned on said composite dielectric layer; and
second and third circuitized substrate portions positioned on opposite sides of said first circuitized substrate portion, each having a second pattern of interconnecting thru-holes therein, said first circuitized substrate portion providing electrical interconnection between said second and third circuitized substrate portions, including interconnecting selected ones of said thru-holes in said second circuitized substrate portion with corresponding thru-holes within said third circuitized substrate portion, said multilayered circuitized structure having no flammability.

20. A method of making a circuitized substrate, said method comprising: providing a composite dielectric layer including a first dielectric sub-layer including a plurality of fibers having a low coefficient of thermal expansion and a halogen-free resin, and a second dielectric sub-layer of a low moisture absorptivity resin, having a moisture absorption less than 0.50% when immersed in water for a period of about 24 hours at a temperature of about 22 degrees C.
and a quantity of inorganic particulates, said second dielectric sub-layer not including continuous or semi-continuous fibers as part thereof; and providing at least one circuitized layer on said composite dielectric layer, said circuitized substrate having no flammability.

21. The method of claim 20 further including providing in said first and second dielectric sub-layers a plurality of thru-holes each having an aspect ratio of the thickness of said composite layer of said circuitized substrate to the diameter of said thru-hole within the range of from about 2:1 to about 20:1.

22. The method of claim 21 wherein said each of said plurality of thru-holes are provided within said first and second sub-layers using a laser.

23. The method of claim 20 wherein said first and second dielectric sub-layers are laminated together.

24. The method of claim 20 further including providing second and third dielectric layers on opposite sides of said composite dielectric layer, respectively, and second and third circuitized layers formed on said second and third dielectric layers, respectively.

25. The method of claim 24 further including electrically coupling at least one electrical component to said second circuitized layer or said third circuitized layer.

26. The multilayered circuitized structure of claim 19 wherein said first dielectric sub-layer of said composite dielectric layer has no more than 0.27% moisture absorption when the sub-layer is immersed in water for a period of about 24 hours at a temperature of about 22 degrees C.

27. The invention of claim 19 wherein said multilayered circuitized structure comprises a printed circuit board.

28. The invention of claim 19 wherein said multilayered circuitized structure comprises a chip carrier.

29. The multilayered circuitized structure of claim 28 further including at least one semiconductor chip positioned on or within said chip carrier and forming part thereof.

30. An information handling system comprising: a housing; a circuitized substrate positioned substantially within said housing and including a composite dielectric layer including a first dielectric sub-layer including a plurality of fibers having a low coefficient of thermal expansion and a halogen-free resin, and a second dielectric sub-layer of a low moisture absorptivity resin, having a moisture absorption less than 0.50% when immersed in water for a period of about 24 hours at a temperature of about 22 degrees C. and a quantity of inorganic particulates, said second dielectric sub-layer not including continuous or semi-continuous fibers as part thereof and at least one electrical component positioned on and electrically coupled to said circuitized substrate, said circuitized substrate having no flammability.

31. The invention of claim 30 wherein said information handling system comprises a personal computer.

32. The invention of claim 30 wherein said information handling system comprises a mainframe computer.

33. The invention of claim 30 wherein said information handling system comprises a computer server.

* * * * *